United States Patent
Barnetson et al.

(10) Patent No.: US 9,033,545 B2
(45) Date of Patent: May 19, 2015

(54) RETROFIT LED LIGHTING SYSTEM

(71) Applicant: Lunera Lighting, Inc., Anaheim, CA (US)

(72) Inventors: Donald Barnetson, San Jose, CA (US); John X Zhang, Walnut Creek, CA (US); Daryl A Cheim, San Jose, CA (US); Ardeshir Esmaeili, San Jose, CA (US)

(73) Assignee: Lunera Lighting Inc., Santa Clara, CA (US)

( * ) Notice: Subject to any disclaimer, the term of this patent is extended or adjusted under 35 U.S.C. 154(b) by 0 days.

(21) Appl. No.: 13/969,613

(22) Filed: Aug. 19, 2013

(65) Prior Publication Data
US 2015/0049490 A1    Feb. 19, 2015

(51) Int. Cl.
*F21K 99/00* (2010.01)

(52) U.S. Cl.
CPC ..................................... *F21K 9/135* (2013.01)

(58) Field of Classification Search
USPC ............................................ 362/249.02, 254
See application file for complete search history.

(56) References Cited

U.S. PATENT DOCUMENTS

| | | | |
|---|---|---|---|
| 2008/0130298 A1* | 6/2008 | Negley et al. | 362/365 |
| 2010/0277082 A1* | 11/2010 | Reed et al. | 315/159 |
| 2012/0248477 A1* | 10/2012 | Tischler et al. | 257/89 |
| 2012/0314414 A1* | 12/2012 | Flaherty et al. | 362/249.02 |

* cited by examiner

*Primary Examiner* — Laura Tso
(74) *Attorney, Agent, or Firm* — Henry J. Cittone; Cittone & Chinta LLP

(57) ABSTRACT

A retrofit LED lighting system for replacement of existing metal halide lamp driven by magnetic ballast is provided. The retrofit lamp includes a circuit that converts the AC current supplied by magnetic ballast to DC current required for illuminating the LEDs.

9 Claims, 4 Drawing Sheets

RETROFIT LED LIGHTING SYSTEM

FIELD OF THE INVENTION

The present invention relates to a lighting system, and more particularly to a LED retrofit lighting system for Metal halide lamp.

BACKGROUND

A metal-halide lamp generates light by passing an electric arc through a gaseous mixture of vaporized mercury and metal halides. The metal halide lamps have high luminous efficiency and produce an intense white light. The metal halide lamps are used in wide area overhead lighting of commercial, industrial, and public spaces, such as parking lots, sports arenas, factories, and retail stores, as well as residential security lighting and automotive headlamps. Approximately 13% of US commercial space uses metal halide lamp for illumination purpose.

The metal halide lamp though used widely suffers from several disadvantages. A cold metal-halide lamp cannot immediately begin producing its full light capacity and requires approximately 5 minutes coming to full brightness. Furthermore if the power is interrupted, even briefly, the lamp's arc will extinguish, and the high pressure that exists in the hot arc tube will prevent re-striking the arc and therefore metal halide lamps must be allowed to cool for up to 20 minutes before they can be restarted.

Apart from having moderate life span of approximately 10000 hours and poor lumen maintenance, the metal halide lamps are hazardous and risky to use. The metal halide lamps contain a significant amount of Mercury and are prone to risk of explosion. Over a period of use, arc tube gets weak and since the gases are present at a significantly high pressure, chances for explosion of the Metal halide lamps are always there.

The most recent evolution in lighting is solid state lighting based on light emitting diode (LED) technology. The light generation principle is similar to what happens in gas discharge lamps, but now the discharge happens in a solid state material: orbit changing electrons cause atoms to get 'excited' that subsequently fall back to their natural state thereby releasing its surplus energy in the form of radiation. The advancement in microelectronics technology has led light-emitting-diode (LED) technology to generate lighting and special purpose lighting applications. The LEDs have a large lifespan of 50,000 hrs and are RoHS compliant, i.e. they do not contain mercury or other toxic substances.

In view of the aforementioned disadvantages associated with the use of metal halide lamps and the technological advancement in LED technology, there is concern rising for replacing metal halide lamps with LED lamps. However the main concern for replacing metal halide lamp with LED lamp is the considerable labor costs involved in the installation, because it will require the opening of the light fixture to disassemble the existing ballast, either it be an electronic one, or a magnetic one. Another concern involved in the replacement of metal halide lamp with LED is the lack of recycle scheme of ballast. Therefore in view of above constraints, it would be advantageous to have LED retrofit lamp that can directly replace the existing metal halide lamps.

BRIEF SUMMARY OF THE INVENTION

The present invention provides a retrofit LED lamp that provides a replacement for a Metal Halide lamp driven by a magnetic ballast. The LED lamp is designed to replace the existing metal halide lamp and consists of a circuit that converts the AC waveform generated by the magnetic ballast into the DC waveform suitable for the LEDs.

The retrofit LED lamp comprises an MCPCB plate mounted with strings of LEDs, a heat sink to dissipate the heat generated by LEDs, a diffuser, a PCB circuit that converts the output from the magnetic ballast into the DC volt required for illuminating LEDs, and a base adaptable to fit into a socket. The PCB circuit comprises a bridge rectifier. The retrofit lamp is compatible with existing magnetic ballast and hence does not require the removal of magnetic ballast while replacing the metal halide lamp with the LED lamp.

BRIEF DESCRIPTION OF THE DRAWINGS

The preferred embodiment of the invention will hereinafter be described in conjunction with the appended drawings provided to illustrate and not to limit the scope of the invention, wherein like designation denote like element and in which.

DETAILED DESCRIPTION OF THE EMBODIMENTS

In the following detailed description of embodiments of the invention, numerous specific details are set forth in order to provide a thorough understanding of the embodiment of invention. However, it will be obvious to a person skilled in art that the embodiments of invention may be practiced with or without these specific details. In other instances well known methods, procedures and components have not been described in detail so as to not unnecessarily obscure aspects of the embodiments of the invention.

Furthermore, it will be clear that the invention is not limited to these embodiments only. Numerous modifications, changes, variations, substitutions and equivalents will be apparent to those skilled in the art, without parting from the spirit and scope of the invention.

The present invention provides a retrofit LED lamp that provides a replacement for a metal halide lamp driven by a magnetic ballast. The circuit of the retrofit LED lamp comprises a bridge rectifier that converts the AC waveform of the magnetic ballast to a single sided waveform to generate DC output that is fed to LED. The frequency of waveform generated by the magnetic ballast is low. Therefore, a traditional rectifier is sufficient to provide the desired DC output required for illumination of LED.

The retrofit lamp is a LED lamp that provides a replacement to the existing metal halide lamp driven by the magnetic ballast. The retrofit lamps work on the electric current supplied by the magnetic ballast, and hence it can directly replace the existing metal halide lamp without removing the existing ballast.

Figure 1:
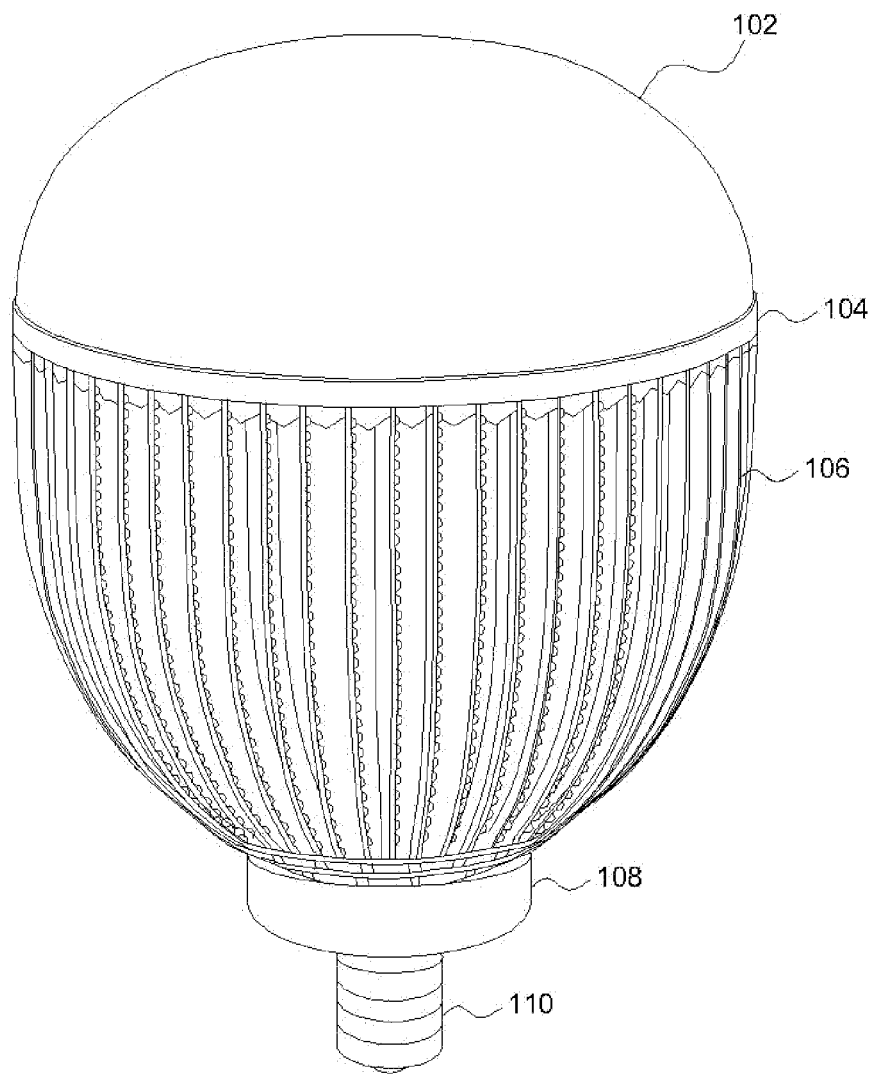
FIG. 1 illustrates a retrofit LED lamp for replacement of a metal halide lamp driven by a magnetic ballast, in accordance with an embodiment of the present invention.

FIG. 1 illustrates a retrofit LED lamp for replacement of a metal halide lamp driven by a magnetic ballast, in accordance with an embodiment of the present invention. Referring to FIG. 1, the retrofit lamp includes a plurality of LEDs mounted on a MCPCB plate 104 and is placed in a housing 106 that keeps the plurality of LEDs in a fixed position. The housing 106 can be circular, semi-circular, cylindrical, rectangular, parabolical or a square housing typically used with lamp. The housing 106 provides a means for heat sink for LEDs by providing a path for heat from the LED source to the outside medium. The thermal conductivity of the material of the housing 106 directly affects dissipation of heat through conduction. The housing 106 can be made of aluminum or copper or thermoplastic material or a natural graphite solution that offer better thermal transfer than copper with a lower weight than aluminum. The heat sink made of natural graphite solution has the ability to be formed into complex two dimensional shapes. The housing 106 is covered with a diffuser 102 to emit the light generated by the plurality of LEDs to outside. At the end of housing 106, a ring plate 108 is attached that contains the circuit for converting the AC input from magnetic ballast to DC waveform. A base connector 110 is provided at the bottom of ring plate 108 for fitting the retrofit lamp into the socket.

In an embodiment of the present invention, the pluralities of LEDs are arranged on the MCPCB Metal Core PCB) plate 104. The MCPCB 104 incorporates a base metal material as heat spreader as an integral part of the circuit board. The base metal material can be aluminum alloy or alternatively it incorporates a dielectric polymer layer with high thermal conductivity for lower thermal resistance. The plurality of LEDs is arranged in a linear manner on the MCPCB plate 104 such that the output angle of the emitted light is perpendicular to the surface of MCPCB plate 104. The MCPCB plate 104 is mounted on the housing 106 through a screw. The housing 106 is meant for dissipation of excess heat generated by the lighting of LEDs. The housing 106 acts as a heat sink for the retrofit lamp assembly. The housing 106 is preferably fabricated from aluminum, though it can also be fabricated from a material having high thermal conductivity that includes, but are not limited to copper, natural graphite or a thermoplastic material. Further, the housing 106 is designed to have a large surface area for maximum heat dissipation. Alternatively, the housing 106 is provided with a number of fine fins. The diffuser 102 is mounted on the housing 106 through a screw for diffusing the light emitted by LED. The diffuser 102 is made of a glass material fabricated in a shape such that the light emitted by the LED is released by the diffuser 102 effectively.

In an embodiment of the present invention, the retrofit lamp may have a curved diffuser 102. Based on the surface area of the shining surface of the panel, the size and thickness of the optimum light diffuser may be determined. The suitable diffuser 102 may be made from a composite material of polymer and glass fiber, or from a polycarbonate/acrylic material. These materials may be designed with varying amounts of hardness and light refractory characteristics. A sufficient hardness and thickness are required for the structural integrity of the overall panel and refractory characteristics, which are also related to the thickness, and are selected in order to cause the light to be transmitted evenly across the diffuser 102. Another advantage of using a sufficiently thick diffuser is that it prevents the LED sources from getting visible. Thus, increasing the aesthetic values and preventing from causing multiple shadows on the object.

The ring plate 108 is provided at the end of housing 106 such that the ring plate 108 seals the bottom circular end of the housing 106. A PCB is mounted on the ring plate 108, where the said PCB comprises a circuit for converting the AC waveform received from the ballast to a DC volt suitable for driving the LEDs. The PCB circuit gets input power from the base connector 110. The base connector 110 fits into the socket meant for metal halide lamp and receives the AC input waveform form the magnetic ballast.

Figure 2A:
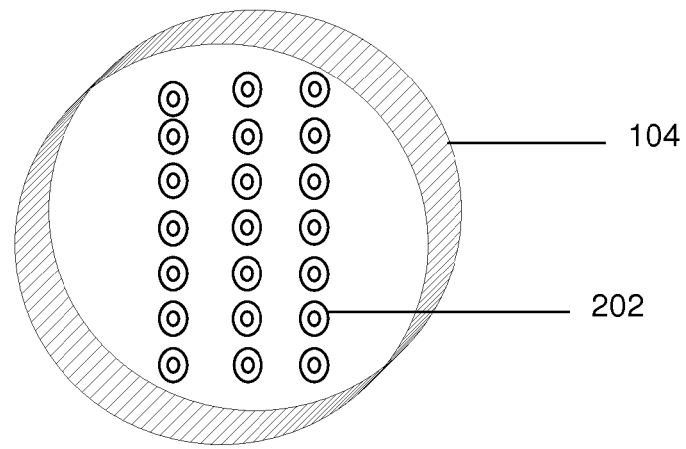
FIG. 2A illustrates a schematic representation of an array of LEDs arranged on a MCPCB plate in accordance with an embodiment of the present invention.
Figure 2B:
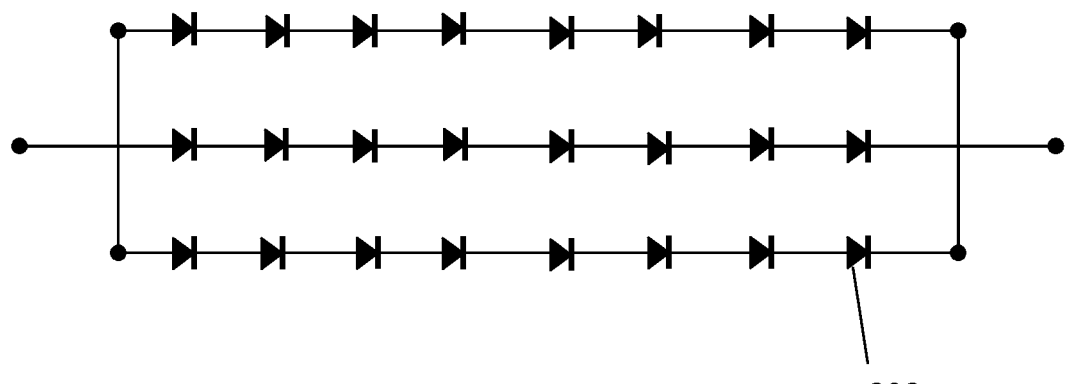
FIG. 2B is a schematic representation LEDs connected in a series to the output of a PCB circuit.

FIGS. 2A and 2B illustrate a schematic representation of an array of LEDs arranged on a MCPCB plate in accordance with an embodiment of the present invention. Referring to FIG. 2A, the MCPCB plate 104 is mounted with a plurality of LEDs 202 arranged in a linear fashion. The plurality of LEDs 202 is arranged on the MCPCB plate in such a manner that the output angle of the light is in perpendicular orientation to the MCPCB plate. Since the diffuser 102 is fitted over the MCPCB plate 104 with horizontal axis parallel to the MCPCB plate 104, hence the light emitted by the plurality of LEDs 202 will pass through the exit aperture directly. This makes the retrofit lamp a directional emitter and over 80 percent of the light is emitted directly from the fixture and only a small amount of the light is emitted towards the surface. The light emitted towards surface will then be reflected from the surface coated with reflector. The characteristic feature of the retrofit lamp, the lamp emitting light directly from the exit aperture makes the optical efficiency of the retrofit lamp greater than 80 percent. The conventional downlight lamps are only 50 percent optical efficient as the downlight metal halide lamp is omni-directional emitter and only a small portion of light is emitted directly from the exit aperture and a large portion of light is emitted after reflection from the lamp surface. FIG. 2B shows a plurality of LEDS 202 connected in a series to the output of PCB circuit.

Figure 3:
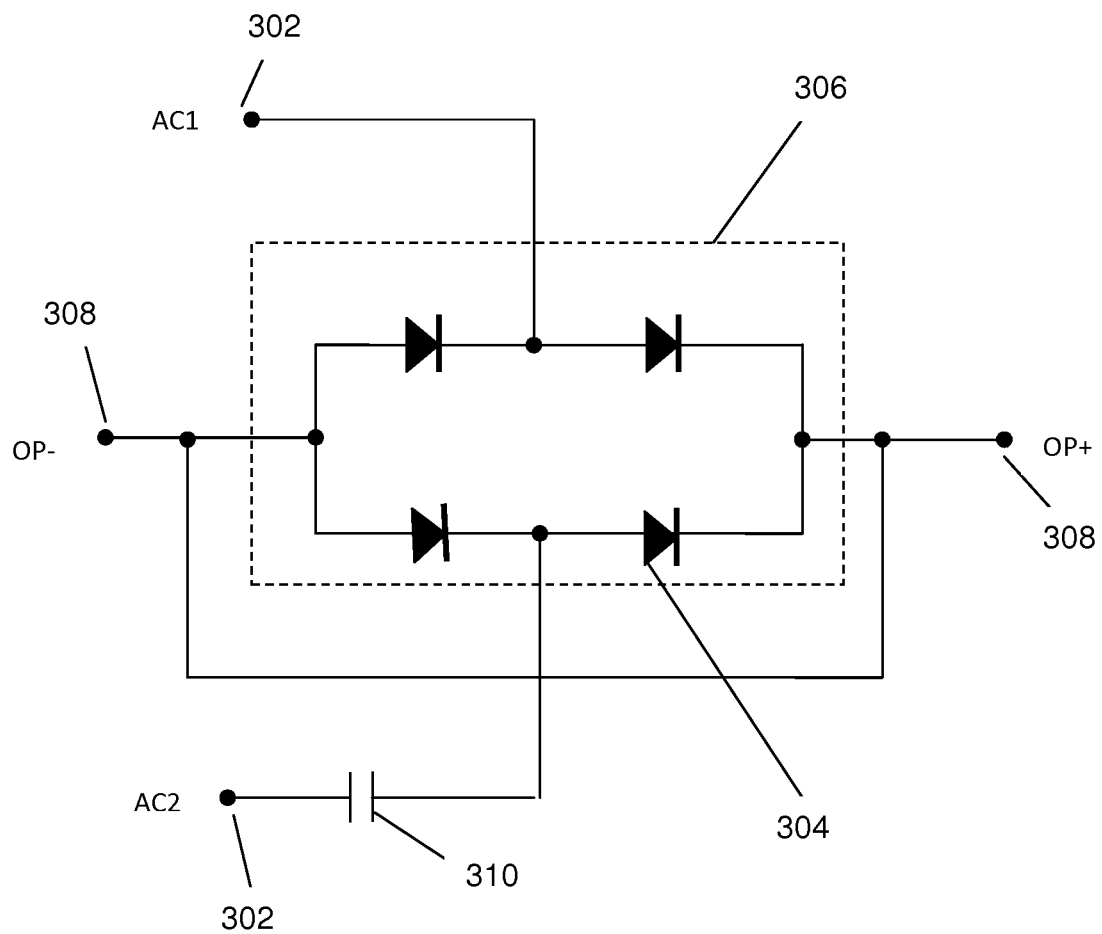
FIG. 3 shows the schematic illustration of the PCB used in LED retrofit lamp, in accordance with an embodiment of the present invention.

FIG. 3 shows the schematic illustration of the PCB used in LED retrofit lamp, in accordance with an embodiment of the present invention. Referring FIG. 3, the output 302 from the magnetic ballast serves as an input to the PCB circuit. The input is then fed into a bridge rectifier 306 that converts the AC waveform of the magnetic ballast to a single sided waveform 308. The bridge rectifier 306 is made of four diodes 304 arranged in a bridge manner. A capacitor 310 may be placed at the input to the bridge rectifier 306. The capacitor 310 reduces the compensation capacitance and helps in bringing the power factor close to 1.

In an embodiment of the present invention the capacitor 310 may be damped with a series resistor to reduce harmonic distortion.

In another embodiment of the present invention, a inductor can be placed after the bridge rectifier 306 to reduce the current crest factor of the waveform presented to the LED 202.

Figure 4:
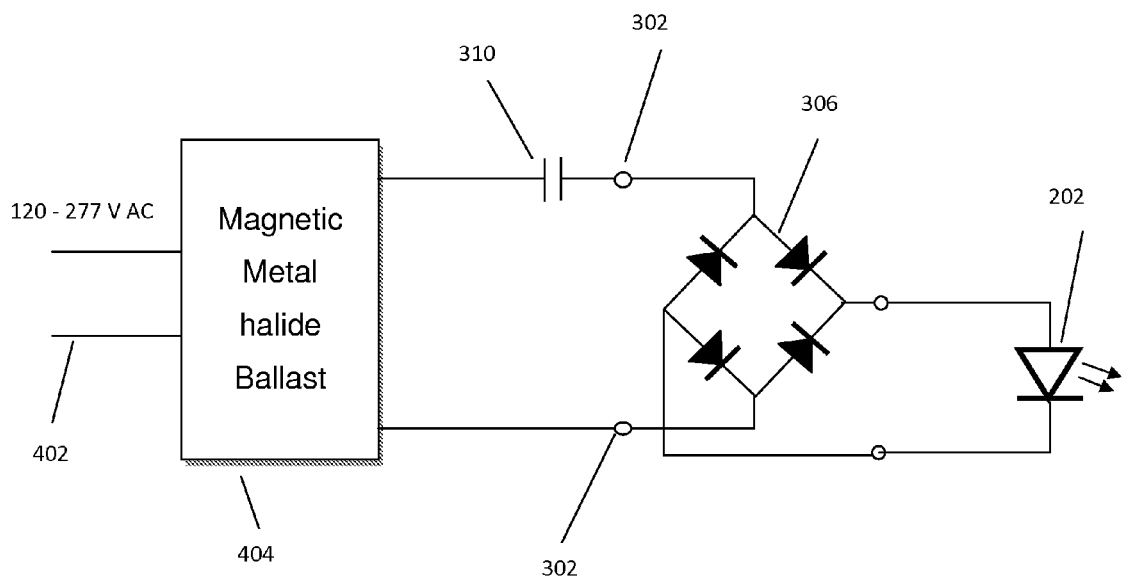
FIG. 4 illustrates a circuit diagram of a retrofit LED lamp driven by a magnetic ballast, in accordance with an embodiment of the present invention.

FIG. 4 illustrates a circuit diagram of a retrofit LED lamp driven by a magnetic ballast, in accordance with an embodiment of the present invention. The AC main supply 402 is supplied as an input to the magnetic metal halide ballast 404. The output from the magnetic metal halide ballast 404 is then fed as an input to a bridge rectifier 306 that converts the AC waveform 302 generated by the magnetic ballast 404 to a single sided waveform. The capacitor 310 is placed in line with the output from the magnetic metal halide ballast 404.

We claim:
1. A retrofit LED lamp for replacing a socket type metal halide lamp driven by a magnetic ballast, the said lamp comprising:
   a string of LED mounted on an MCPCB plate;
   a housing that serves as a mean for dissipating the heat generated by LED;

a diffuser placed over the MCPCB plate to diffuse the light emitted by LED;

a PCB circuit to provide the voltage input to the string of LED, the said PCB circuit comprises a bridge rectifier to convert the output from the magnetic ballast to DC current required to illuminate the string of LED; and a base connector adapted to fit into the socket meant for metal halide lamp, the said base connector provides electrical connection between the output of magnetic ballast and the said PCB circuit;

wherein the retrofit LED lamp works on the electric current supplied by magnetic ballast and can operate without removing the magnetic ballast.

2. The retrofit LED lamp of claim 1 wherein the MCPCB plate is fabricated from material consisting of aluminum alloy or dielectric polymer.

3. The retrofit LED lamp of claim 1 wherein the string of LED is mounted on the surface of the MCPCB plate.

4. The retrofit LED lamp of claim 1 wherein the diffuser is made from composite material of polymer and glass fiber, or from a polycarbonate/acrylic material.

5. The retrofit LED lamp of claim 1 wherein the diffuser diffuses the light emitted by the string of LEDs.

6. The retrofit LED lamp of claim 1 wherein the housing is fabricated from the material consisting of aluminum, copper, thermoplastic material, or natural graphite.

7. The retrofit LED lamp of claim 1 wherein the bridge rectifier that converts AC waveform into DC waveform consists of four diodes arranged in a bridge manner.

8. The retrofit LED lamp of claim 1 wherein the PCB circuit has an inductor coil to reduce current crest factor.

9. The retrofit LED lamp of claim 1 wherein a capacitor is used in the PCB circuit to enhance the power factor.

* * * * *